(12) United States Patent
Liao

(10) Patent No.: US 6,939,140 B2
(45) Date of Patent: Sep. 6, 2005

(54) LAND GRID ARRAY CONNECTOR ASSEMBLY WITH PICK-UP CAP

(75) Inventor: Fang-Jwu Liao, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/879,418

(22) Filed: Jun. 28, 2004

(65) Prior Publication Data

US 2004/0266248 A1 Dec. 30, 2004

(30) Foreign Application Priority Data

Jun. 27, 2003 (TW) .................................. 92211780 U

(51) Int. Cl.⁷ .............................................. H01R 13/60
(52) U.S. Cl. ........................ 439/41; 439/331; 439/342
(58) Field of Search ........................ 439/41, 331, 342, 439/135

(56) References Cited

U.S. PATENT DOCUMENTS

| | | | |
|---|---|---|---|
| 5,302,853 A | * | 4/1994 | Volz et al. .................. 257/707 |
| 5,819,404 A | | 10/1998 | Whiting |
| 6,413,111 B1 | | 7/2002 | Pickles et al. |
| 6,478,588 B1 | | 11/2002 | Howell et al. |
| 6,533,592 B1 | | 3/2003 | Chen et al. |
| 6,547,609 B2 | | 4/2003 | Howell et al. |
| 6,561,825 B1 | | 5/2003 | McHugh et al. |
| 6,572,383 B1 | | 6/2003 | Yu |
| 6,626,691 B2 | * | 9/2003 | Yu .............................. 439/342 |
| 2004/0248442 A1 | * | 12/2004 | Huang ........................ 439/135 |

* cited by examiner

Primary Examiner—Hae Moon Hyeon
(74) Attorney, Agent, or Firm—Wei Te Chung

(57) ABSTRACT

An LGA connector assembly (1) includes an LGA connector (2) and a generally rectangular pick-up cap (3). The connector includes an insulative housing (21), a plurality of contacts (22) received in the housing, and a metal clip (25) mounted on the housing. The clip is disposed on the housing to press the CPU upon the contacts and has two opposite slant sides (256). The pick-up cap is generally rectangular, and has clasps (307, 308) at two opposite ends thereof. The clasp defines a first and second sidewalls (314, 316) at two opposite ends thereof, a declining face (318) connecting the first and second sidewalls. The declining face declines at a same direction as the slant sides of the clip. The clasps snappingly clasp sides of the clip of the connector, thereby securely mounting the pick-up cap onto the connector.

15 Claims, 4 Drawing Sheets

LAND GRID ARRAY CONNECTOR ASSEMBLY WITH PICK-UP CAP

CROSS-REFERENCE TO RELATED APPLICATION

The present invention relates to a co-pending U.S. patent application Ser. No. 10/613,468 filed on Jul. 3, 2003, entitled "LAND GRID ARRAY CONNECTOR ASSEMBLY WITH PICK-UP CAP", invented by Fang-Jwu Liao, and assigned to the same assignee as the present invention.

BACKGROUND OF THE INVENTION

1. Field of the Invention

The present invention relates to a land grid array (LGA) connector assembly which comprises an LGA connector and a pick-up cap mounted on the LGA connector for providing a plane surface to be engaged by a vacuum suction device, whereby the LGA connector assembly can be moved onto a circuit substrate such as a printed circuit board (PCB) on which the LGA connector is to be mounted.

2. Description of the Prior Art

On many production lines, electronic components such as land grid array (LGA) connectors are accurately positioned on circuit substrates such as printed circuit boards (PCBs) by means of vacuum suction devices. Such an LGA connector typically comprises an insulative housing, a plurality of electrical contacts received in the housing, a metal clip pivotably mounted onto an end of the housing, and a lever pivotably mounted onto an opposite end of the housing for engaging with the clip. The clip has a generally rectangular window in a middle thereof. Each contact has first contact portion protruding outwardly from a top portion of the housing, for electrically connecting with a corresponding metal contact pad of an electronic package such as an LGA central processing unit (CPU). Because of this configuration of the LGA connector, a pick-up cap has to be pre-attached on the top portion of the housing. The pick-up cap has a generally rectangular body and typically has a plurality of latches perpendicularly extending from lateral sides of the body and snappingly engaging with corresponding sidewalls of the clip, thereby mounting the pick-up cap onto the LGA connector. The pick-up cap has a flat top surface exposing through the window. The vacuum suction device is then able to engage on the flat top surface of the pick-up cap, in order to reliably move and accurately position the LGA connector onto the PCB.

However, during attachment of the pick-up cap onto the LGA connector or detachment of the pick-up cap from the LGA connector, the latches of the pick-up cap are liable to hit the first contact portions of some of the contacts and displace those contacts. The displaced contacts cannot reliably contact the corresponding metal contact pads of the CPU, and electrical connection between the CPU and the PCB is liable to be disrupted. In addition, the sidewalls of the clip are slant, and the pick-up cap has only the generally rectangular planar body and latches perpendicularly extending from lateral sides of the body. When engagement of the pick-up cap with the LGA connector, this configuration of the pick-up cap and the sidewalls of the clip will increase the difficulty in mounting the pick-up cap upwardly onto the connector.

Thus, there is a need to provide a new electrical connector assembly with pick-up cap that overcomes the above-mentioned problems.

SUMMARY OF THE INVENTION

Accordingly, an object of the present invention is to provide a land grid array (LGA) connector assembly which has an LGA connector and a pick-up cap mounted on the connector, wherein the pick-up cap is configured to ensure reliable connection of the pick-up cap with the connector.

To fulfill the above-mentioned object, an LGA connector assembly in accordance with a preferred embodiment comprises an LGA connector and a generally rectangular pick-up cap mounted on the connector. The connector comprises an insulative housing, a plurality contacts received therein, and a metal clip mounted on the housing. The housing defines a generally rectangular cavity for receiving an electronic package such as an LGA central processing unit (CPU) therein. A multiplicity of terminal-passages is defined in a portion of the housing around the cavity, for receiving a corresponding number of the contacts therein. The clip is disposed on the housing to press the CPU upon the contacts. The clip has two opposite slant sides. The pick-up cap has a generally rectangular planar body, and a plurality of clasps perpendicularly extending from lateral sides of the body. The clasps respectively has a first sidewall perpendicular to the body, a second sidewall opposite to the first sidewall, a declining face connecting the first sidewall and the second sidewall. The declining face is declined from the first sidewall to the second sidewall so that a width of the first sidewall is wider than that of the second sidewall along a same direction as the slant sides of the clip. Because the declining direction of the declining face is the same as the slant sides of the clip, when the pick-up cap is engaged with the connector, the clasps of the pick-up cap can snappingly clasp the sides of the clip, thereby securely mounting the pick-up cap onto the connector.

Other objects, advantages and novel features of the present invention will become more apparent from the following detailed description when taken in conjunction with the accompanying drawings, in which:

DESCRIPTION OF PREFERRED EMBODIMENT OF THE INVENTION

Reference will now be made to the drawings to describe the present invention in detail.

Figure 1:
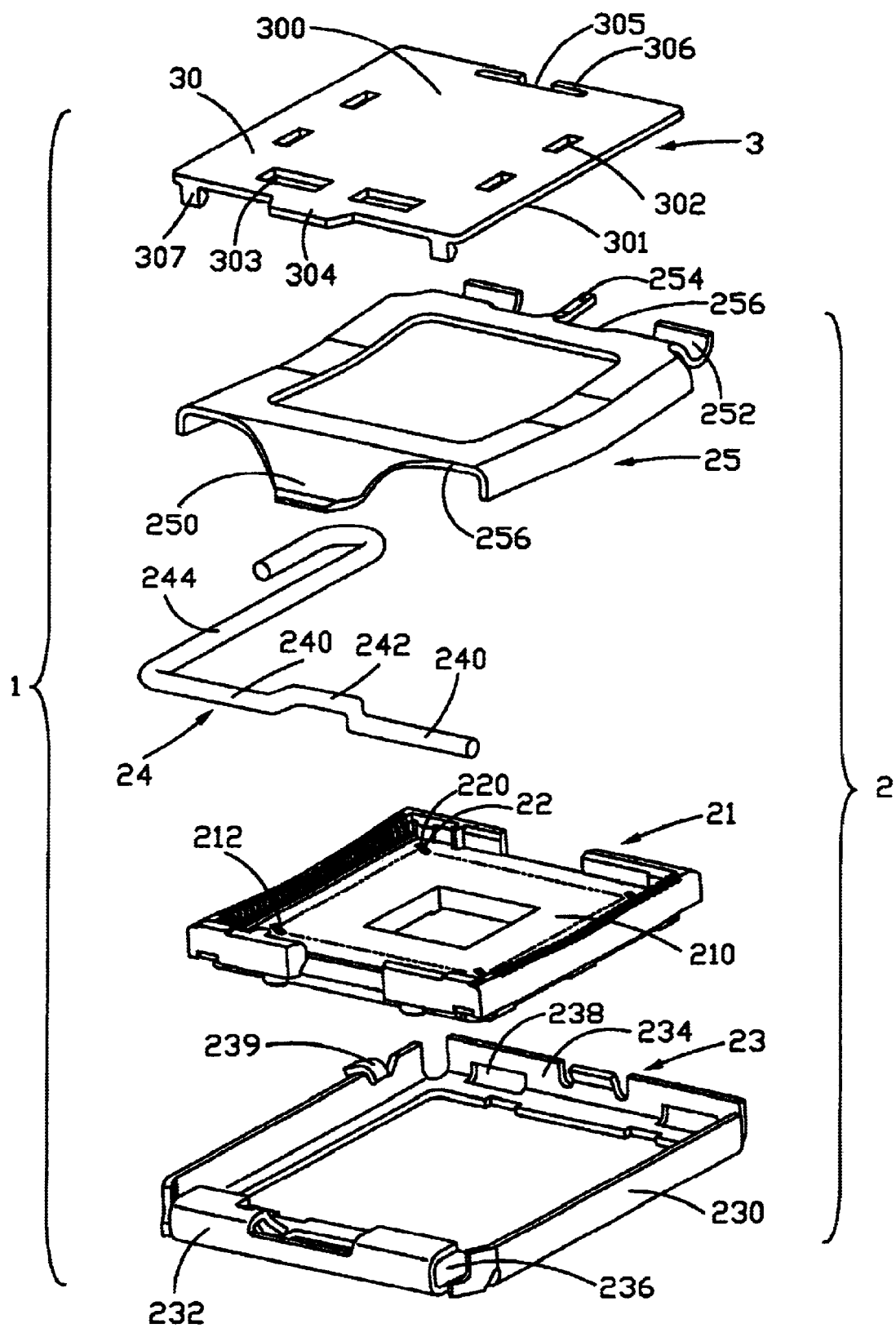
FIG. 1 is an exploded, isometric view of an electrical connector assembly of the present invention, the electrical connector assembly comprising an electrical connector and a pick-up cap ready to mount on the connector.

FIG. 1 is an exploded, isometric view of a land grid array (LGA) connector assembly 1 in accordance with the preferred embodiment of the present invention. The LGA connector assembly 1 comprises an LGA connector 2 and a generally rectangular pick-up cap 3. The pick-up cap 3 is mounted on the connector 2, for providing a plane surface to be engaged by a vacuum suction device. The LGA connector assembly 1 can thereby be placed onto a circuit substrate, such as a printed circuit board (PCB) (not shown), on which the connector 2 is to be positioned.

The connector 2 comprises a generally rectangular insulative housing 21, a multiplicity of contacts 22 received in the housing 21, a metal stiffener 23 partly covering and reinforcing the housing 21, a lever 24 pivotably received in an end of the stiffener 23, and a metal clip 25 pivotably mounted to an opposite end of the stiffener 23 for engaging with the lever 24.

The housing 21 defines a generally rectangular cavity 210 in a middle thereof. The cavity 210 is used for receiving an electronic package such as an LGA central processing unit (CPU) (not shown) therein. A multiplicity of terminal-passages 212 is defined in a portion of the housing 21 around the cavity 210, for receiving a corresponding number of the contacts 22 therein respectively. Each contact 22 has a first contacting portion 220 protruding outwardly from a top face of the housing 21, for resiliently electrically contacting a corresponding pad of the CPU.

The stiffener 23 comprises a pair of lateral sides 230 each having an L-shaped cross-section, a front end 232 having a U-shaped cross-section, and a rear end 234 having an L-shaped cross-section. The housing 21 is fittingly received in the stiffener 23. An elongate chamber 236 is defined in the front end 232 of the stiffener 23. A pair of spaced slots 238 is defined in the rear end 234 of the stiffener 23. An ear 239 extends arcuately from an edge of one of the lateral sides 230 of the stiffener 23.

The lever 24 comprises a pair of locating portions 240 pivotably received in the chamber 236 of the stiffener 23, an offset actuating portion 242 between the locating portions 240, and an operating portion 244 extending perpendicularly from an end of one of the locating portions 240. The operating portion 244 is disposed outside of the stiffener 23. When oriented at a horizontal position parallel to the top face of the housing 21, the operating portion 244 engages with the ear 239.

The clip 25 comprises two opposite slant sides 256, an engaging portion 250 extending arcuately from a side 256 thereof, a pair of spaced securing portions 252 extending arcuately from an opposite side 256 thereof and pivotably received in the slots 238 of the stiffener 23, and a tail 254 between the securing portions 252. When the clip 25 is oriented at a horizontal position parallel to the top face of the housing 21, the engaging portion 250 of the clip 25 engages with the actuating portion 242 of the lever 24, thereby pressing the CPU on the contacts 22. When the clip 25 is oriented at a position perpendicular to the top face of the housing 21, the tail 254 abuts against the stiffener 23 to prevent the clip 25 from being over-rotated.

The pick-up cap 3 has a generally rectangular planar body 30. The planar body 30 comprises a flat top surface 300, and a bottom surface 301 opposite to the top surface 300. Two generally rectangular first holes 302 are defined in each of opposite lateral sides of the planar body 30. Two generally rectangular second holes 303 are defined in a front end of the planar body 30. Each of the second holes 303 is larger than each of the first holes 302. A trapeziform lip 304 is formed at a middle of the front end of the planar body 30, for facilitating a user operating the pick-up cap 3 during detachment of the pick-up cap 3 from the connector 2. A generally T-shaped channel 305 is defined in a middle of an opposite rear end of the planar body 30, thereby forming a pair of opposing arms 306.

Figure 2:
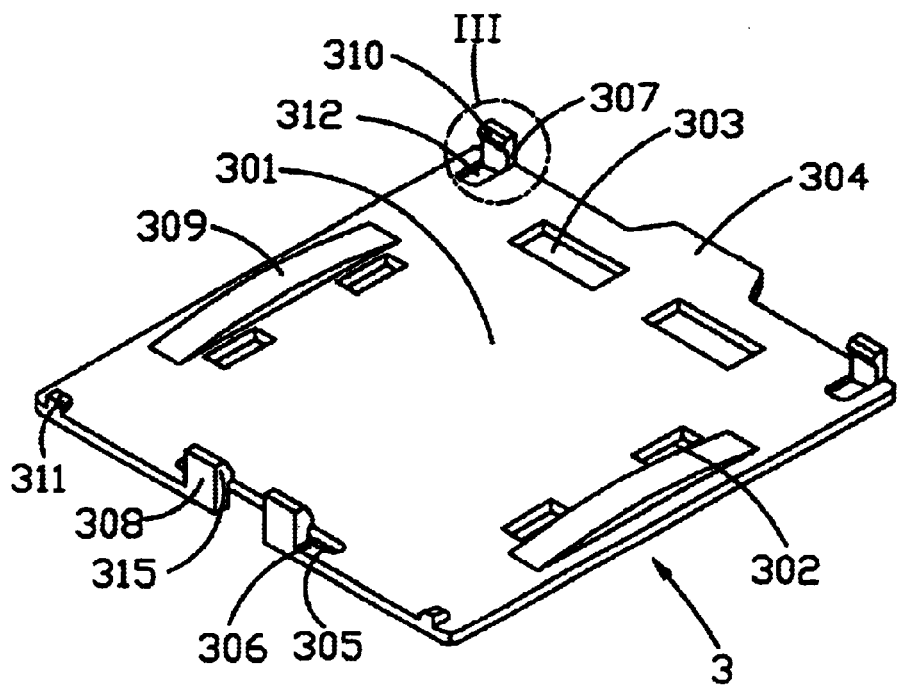
FIG. 2 is an isometric view of the pick-up cap of FIG. 1, but showing the pick-up cap inverted.
Figure 3:
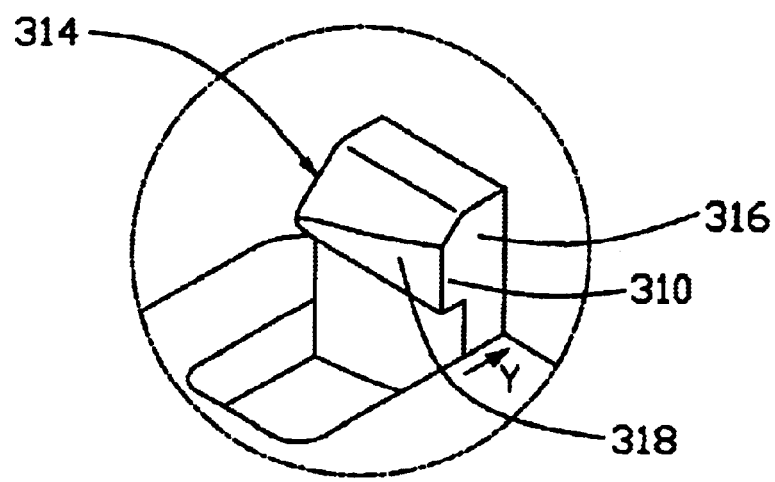
FIG. 3 is an enlarged view of a circled portion III of FIG. 2.

Referring to FIGS. 2 and 3, a pair of first clasps 307 is formed at opposite sides of the front end of the planar body 30 respectively. The first clasps 307 depend from the bottom surface 301 of the planar body 30. A first hook portion 310 is defined in a distal end of the first clasp 307. The first hook portion 310 has a first and second sidewalls 314, 316, and a first declining face 318 connecting the first and second sidewalls 314, 316. The declining face 318 declines a same direction as the slant sides 256 so that the width of the first sidewall 314 is wider than that of the second sidewall 316 along a direction, as indicated by arrow Y in FIG. 3. A recess 312 is defined in a portion of the planar body 30 adjacent to a rear portion of each first clasp 307, thereby increasing a resilience of the clasp 307. A pair of second clasps 308 is formed at the rear end of the planar body 30. The second clasps 308 depend from free ends of the arms 306 respectively. A second hook portion 315 is defined at a distal end of the second clasp 308. In the preferred embodiment of the present invention, a configuration and size of each second hook portion 315 is similar to a configuration and size of each first hook portion 310. A pair of protrusions 311 is formed at opposite sides of the rear end of the planar body 30 respectively. The protrusions 311 depend from the bottom surface 301. A pair of parallel arcuate ribs 309 is formed at the opposite lateral sides of the planar body 30 respectively. The ribs 309 depend from the bottom surface 301.

Figure 4:
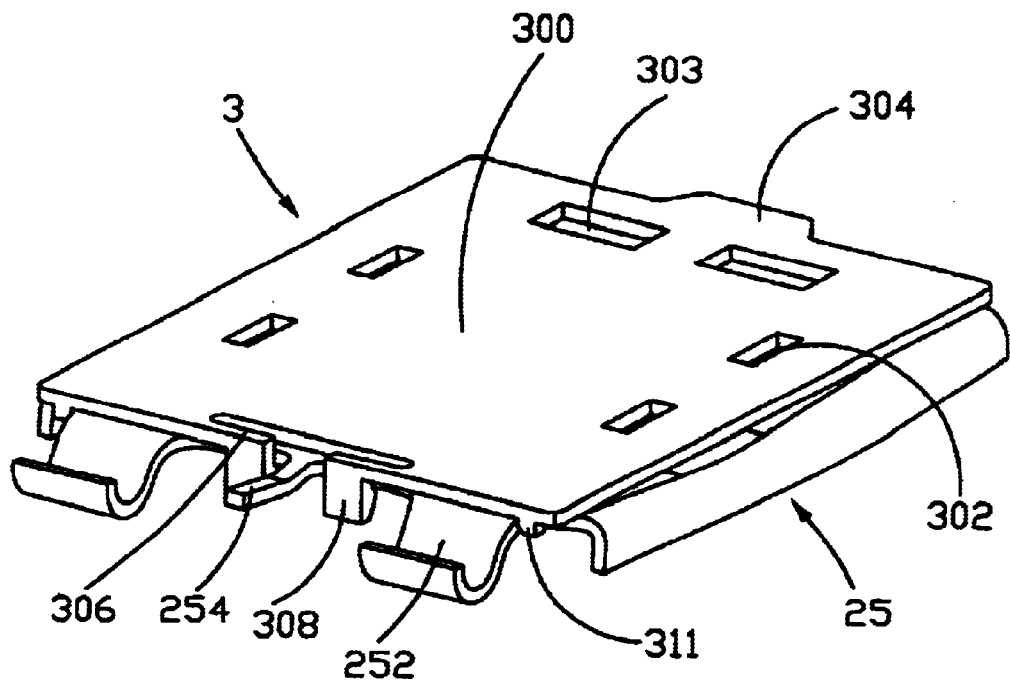
FIG. 4 is an assembled view of the pick-up cap and a clip of the connector of FIG. 1, but viewed from another aspect.
Figure 5:
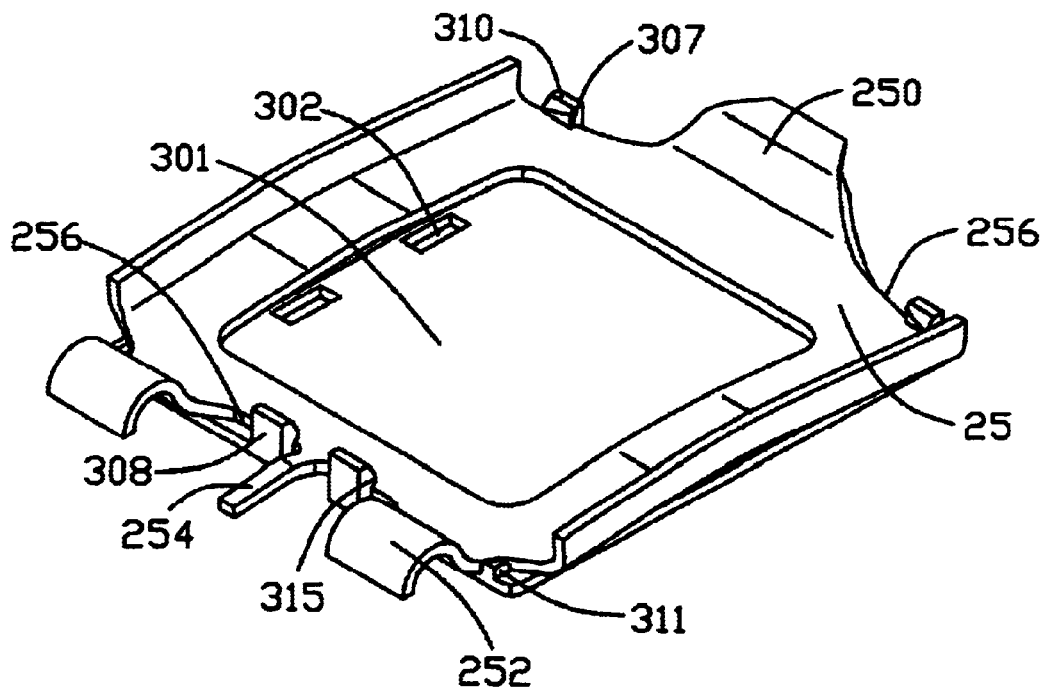
FIG. 5 is an assembled view of the pick-up cap and the clip of the connector of FIG. 1, but showing the pick-up cap and the clip inverted.
Figure 6:
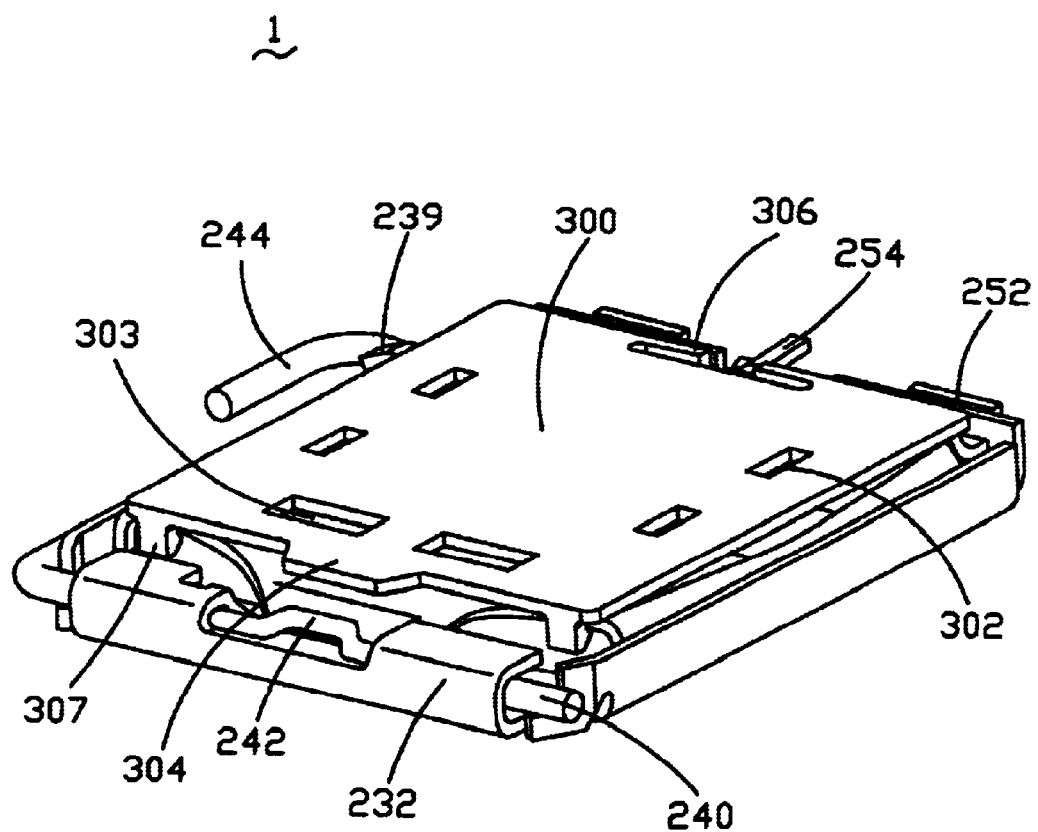
FIG. 6 is an assembled view of FIG. 1.

Referring to FIGS. 4, 5 and 6, in attaching the pick-up cap 3 onto the connector 2, the pick-up cap 3 is disposed over the connector 2, with the first and second clasps 307, 308 loosely contacting corresponding sides 256 of the clip 25 respectively. The pick-up cap 3 is pressed down. The first hook portions 310 of the first clasps 307 and the second hook portions 315 of the second clasps 308 are elastically deflected outwardly. When the ribs 309 of the pick-up cap 3 contact the clip 25 and the channel 305 receives the tail 254 of the clip 25, the first and second hook portions 310, 315 snappingly clasp the corresponding sides 256 of the clip 25, and the protrusions 311 abut against the corresponding side 256 of the clip 25. The pick-up cap 3 is thereby securely mounted onto the connector 2. In this position, a vacuum suction device (not shown) can engage the top surface 300 of the pick-up cap 3 in order to move the connector assembly 1 to a desired location on the PCB. At this time, the declining face 318 of the first clasp 307 is declined in the same direction as the slant sides 256 of the clip 25. Therefore, when the first and second clasps 307, 308 snappingly clasp the two opposite sides 256 of the clip 25, the pick-up cap 3 is subsequently attached onto the connector 2. Thus then ensure reliable connection between the pick-up cap 3 and the connector 2.

During welding of the connector assembly 1 on the PCB, the holes 302, 303 facilitate dissipation of generated heat. Once the connector 2 has cooled down, the lip 304 of the pick-up cap 3 is pulled upwardly, and the pick-up cap 3 is detached from the clip 25 of the connector 2.

As will be appreciated from the foregoing description, during attachment of the pick-up cap 3 onto the clip 25 of the connector 2 and detachment of the pick-up cap 3 from the clip 25, the first and second clasps 307, 308 do not contact the first contacting portions 220 of the contact 22. Use of the pick-up cap 3 does not damage the connector 2.

Although the present invention has been described with reference to a particular embodiment, it is not to be construed as being limited thereto. Various alterations and modifications can be made to the embodiment without in any way departing from the scope or spirit of the present invention as defined in the appended claims.

What is claimed is:

1. A land grid array (LGA) connector assembly, comprising:
   an insulative housing defining a substantially rectangular cavity in a middle thereof, the cavity being adapted for receiving an electronic package therein;
   a plurality of electrical contacts received in the housing;
   a metal clip disposed on the housing to press the electronic package upon the contacts and having two opposite slant sides; and
   a pick-up cap mounted on the clip, the pick-up cap having a planar body and a plurality of clasps extending downwardly from two opposite ends of the body, each clasp having a first sidewall perpendicularly to the body, and a second sidewall opposite to the first sidewall, wherein the width of the first sidewall is not the same as the second sidewall to make the clasp incline in a same direction as the sides of the clip, for providing reliable connection between the pick-up cap and the clip.

2. The LGA connector assembly as claimed in claim 1, wherein the clasp comprises a declining face connecting the first sidewall and the second sidewall, the declining face declined in the same direction as the sides of the clip.

3. The LGA connector assembly as claimed in claim 2, wherein the first sidewall is wider than the second sidewall.

4. The LGA connector assembly as claimed in claim 3, wherein the clasps comprise a first clasp and a second clasp.

5. The LGA connector assembly as claimed in claim 4, wherein the first clasp is formed at a front end of the body, the first clasp depended from the bottom surface of the body and clasping snappingly a corresponding side of the clip.

6. The LGA connector assembly as claimed in claim 5, wherein a recess is defined in a portion of the body adjacent a rear of the first clasp.

7. The LGA connector assembly as claimed in claim 5, wherein a T-shaped channel is defined in a middle of a rear end of the body to form a pair of opposing arms.

8. The LGA connector assembly as claimed in claim 1, wherein the body has a top surface and a bottom surface opposite to the top surface.

9. The LGA connector assembly as claimed in claim 8, wherein a pair of protrusions is formed at opposite sides of a rear end of the body respectively, the protrusions depended from the bottom surface and abutted against a corresponding side of the clip.

10. The LGA connector assembly as claimed in claim 8, wherein two generally rectangular first holes are defined in each of opposite lateral sides of the body, and two generally rectangular second holes are defined in a front end of the body.

11. The LGA connector assembly as claimed in claim 10, wherein each of the second holes is larger than each of the first holes.

12. The LGA connector assembly as claimed in claim 8, wherein a pair of parallel arcuate ribs is formed at opposite sides of the body, the ribs depended from the bottom surface of the body.

13. A connector assembly, comprising:
    an insulative housing;
    a plurality of electrical contacts received in the housing;
    a metal clip disposed on the housing and having at least one slant edge; and
    a pick-up cap mounted on the clip, the pick-up cap having a planar body and a plurality of clasps extending downwardly from two opposite ends of the body, each clasp defining a hook portion at a distal end for latching to the clip; wherein
    after assembled, a latchable engagement area of the hook portion is not rectangular but wedged so as to comply with a configuration of said slant edge.

14. The connector assembly as claimed in claim 13, wherein said latchable engagement area extends horizontally.

15. A connector assembly, comprising:
    an insulative housing;
    a plurality of electrical contacts received in the housing;
    a metal clip disposed on the housing and having at least one slant edge; and
    a pick-up cap mounted on the clip, the pick-up cap having a planar body and a plurality of clasps extending downwardly from two opposite ends of the body, each clasp defining a hook portion at a distal end for latching to the clip; wherein
    an oblique passing face is defined on an exterior side of the hook portion for confrontation with the slant edge during assembling, and said oblique passing face is not rectangular.

* * * * *